(12) United States Patent
Shiraishi et al.

(10) Patent No.: US 12,526,932 B2
(45) Date of Patent: Jan. 13, 2026

(54) ELECTRONIC DEVICE

(71) Applicant: KABUSHIKI KAISHA TOYOTA JIDOSHOKKI, Aichi (JP)

(72) Inventors: Kazuhiro Shiraishi, Aichi (JP); Keiji Yashiro, Aichi (JP); Yusuke Iwase, Aichi (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 152 days.

(21) Appl. No.: 18/601,169

(22) Filed: Mar. 11, 2024

(65) Prior Publication Data
US 2024/0334621 A1  Oct. 3, 2024

(30) Foreign Application Priority Data

Mar. 31, 2023 (JP) .................................. 2023-059026

(51) Int. Cl.
*H05K 5/00* (2025.01)
*H05K 5/04* (2006.01)

(52) U.S. Cl.
CPC .............. *H05K 5/0052* (2013.01); *H05K 5/04* (2013.01)

(58) Field of Classification Search
None
See application file for complete search history.

(56) References Cited

U.S. PATENT DOCUMENTS

| | | | | |
|---|---|---|---|---|
| 4,799,314 A | * | 1/1989 | Lake | H05K 7/142 361/752 |
| 5,872,332 A | * | 2/1999 | Verma | H05K 5/0047 361/752 |
| 9,480,191 B2 | * | 10/2016 | Yui | H05K 9/0007 |
| 2005/0018352 A1 | * | 1/2005 | Hong | H05K 3/365 360/264.2 |
| 2022/0115854 A1 | * | 4/2022 | Shimizu | H05K 1/0219 |

FOREIGN PATENT DOCUMENTS

| | | |
|---|---|---|
| JP | 2-102787 | 8/1990 |
| JP | 2004-327784 | 11/2004 |

* cited by examiner

*Primary Examiner* — Allen L Parker
*Assistant Examiner* — Christopher L Augustin
(74) *Attorney, Agent, or Firm* — Greenblum & Bernstein, P.L.C.

(57) ABSTRACT

An electronic device includes a housing made of metal, a circuit board on which a circuit pattern is formed, and an electronic component mounted on the circuit board. The housing has a boss that is formed in a columnar shape protruding toward the circuit board and to which the circuit board is fixed by a fastening member made of metal. The boss has a fastening hole into which the fastening member is screwed and a contact surface with which a ground pattern in the circuit pattern is in contact. The contact surface has a recessed surface that is recessed toward the fastening hole. The circuit board has a protruding surface that protrudes such that the ground pattern is in contact with the recessed surface.

6 Claims, 4 Drawing Sheets

ELECTRONIC DEVICE

BACKGROUND ART

This application claims priority to Japanese Patent Application No. 2023-059026 filed on Mar. 31, 2023, the entire disclosure of which is incorporated herein by reference.

The present disclosure relates to an electronic device.

There is known an electronic device including a circuit board, electronic components mounted on the circuit board, and a metal housing accommodating the circuit board and the electronic components, for example. A circuit pattern is formed on the circuit board. A part of the circuit pattern is grounded through the housing to serve as a ground pattern. With this configuration, noise is transmitted between the ground pattern of the circuit board and the housing.

A housing of an electronic device described in Japanese Patent Application Publication No. 2004-327784 has columnar bosses protruding toward the circuit board. The circuit board is fixed to the bosses by fastening members made of metal. Each of the bosses includes a fastening hole into which the corresponding fastening member is screwed and a contact surface with which the circuit board is in contact.

When fastening members by which the ground pattern of the circuit board is grounded through the housing are employed in the electronic device described in the Publication, contact areas between the contact surfaces of the bosses and the ground pattern of the circuit board are small. As a result, noise may not be suitably transmitted between the ground pattern of the circuit board and the housing.

SUMMARY

In accordance with an aspect of the present disclosure, there is provided an electronic device that includes a housing made of metal, a circuit board that is accommodated in the housing and on which a circuit pattern is formed, and an electronic component that is accommodated in the housing and mounted on the circuit board. The housing has a boss that is formed in a columnar shape protruding toward the circuit board and to which the circuit board is fixed by a fastening member made of metal. The boss has a fastening hole into which the fastening member is screwed and a contact surface with which a ground pattern in the circuit pattern is in contact. The ground pattern is grounded through the housing. The contact surface has a recessed surface that is recessed toward the fastening hole from an outer peripheral surface of the boss. The circuit board has a protruding surface that protrudes such that the ground pattern is in contact with the recessed surface.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the embodiments together with the accompanying drawings in which.

DETAILED DESCRIPTION OF THE EMBODIMENTS

The following will describe an inverter as an embodiment of an electronic device with reference to the drawings. The inverter of the present embodiment is configured to drive a motor of an electric compressor used for a vehicle air conditioner.

<Vehicle Air Conditioner>

Figure 1:
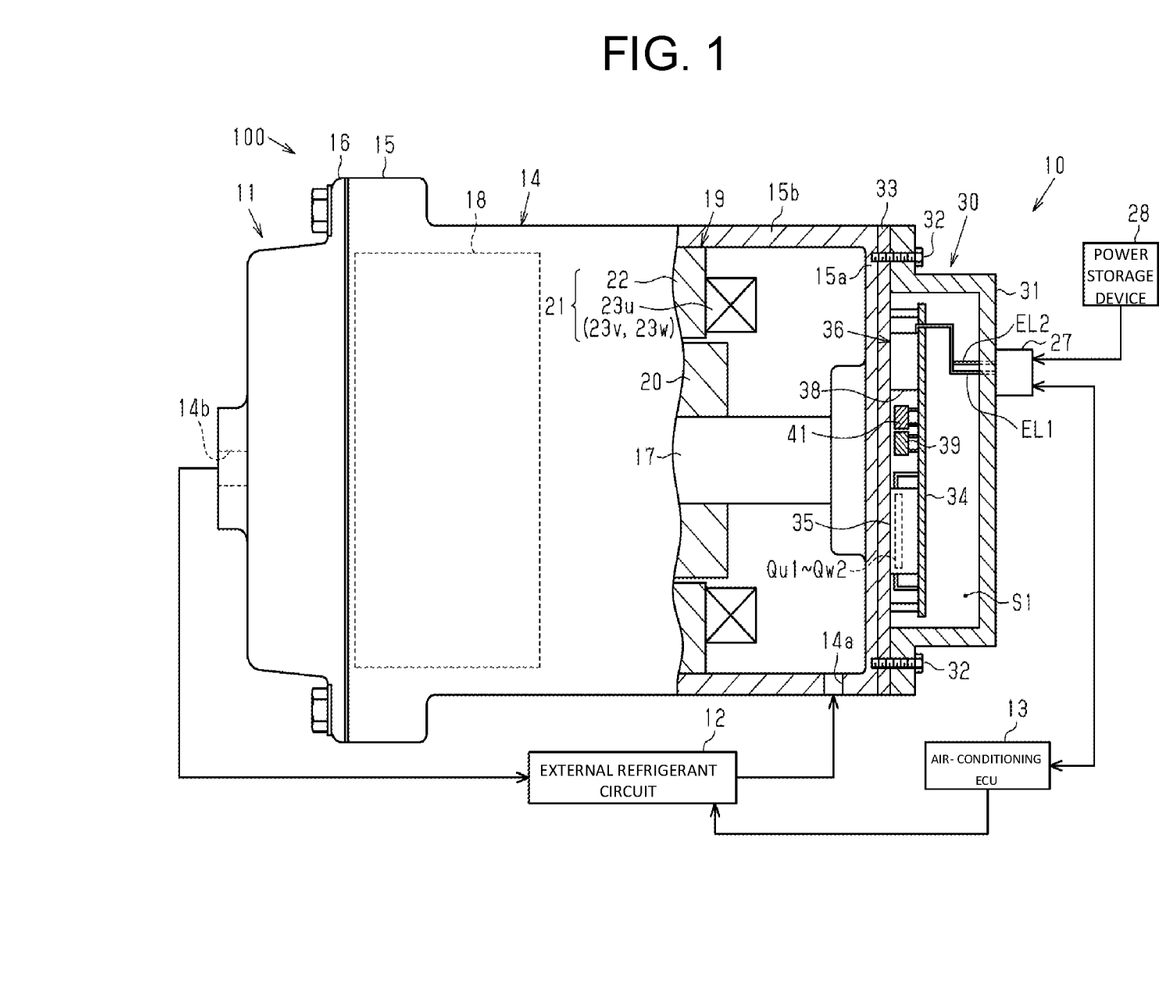
FIG. 1 is a cross-sectional view illustrating a vehicle air conditioner including an inverter as an electronic device.

As illustrated in FIG. 1, a vehicle air conditioner 10 includes an electric compressor 11 and an external refrigerant circuit 12. A refrigerant as fluid is supplied from the external refrigerant circuit 12 to the electric compressor 11. The external refrigerant circuit 12 includes, for example, a heat exchanger and an expansion valve. The vehicle air conditioner 10 performs heating and cooling of a vehicle interior by the electric compressor 11 that compresses the refrigerant and the external refrigerant circuit 12 through which heat is exchanged from or to the refrigerant and the refrigerant is expanded.

The vehicle air conditioner 10 includes an air-conditioning ECU 13. The air-conditioning ECU 13 controls the entire vehicle air conditioner 10. The air-conditioning ECU 13 is configured to obtain a temperature inside a vehicle 100 and a setting temperature of the vehicle air conditioner 10. The air-conditioning ECU 13 sends various commands such as ON/OFF commands to the electric compressor 11, based on parameters such as the temperature inside the vehicle 100 and the setting temperature of the vehicle air conditioner 10.

<Basic Configuration of Electric Compressor>

The electric compressor 11 includes a housing 14. The housing 14 is made of a metal material with heat transfer properties, for example, aluminum. That is, the housing 14 is made of metal. The housing 14 is connected to a body of the vehicle 100 as a ground point.

The housing 14 includes a suction housing 15 and a discharge housing 16. The suction housing 15 is assembled to the discharge housing 16. The suction housing 15 has an end wall 15a formed in a plate shape and a peripheral wall 15b formed in a tubular shape. The peripheral wall 15b is formed in the tubular shape extending from an outer peripheral edge of the end wall 15a. The discharge housing 16 is assembled to the suction housing 15 while closing an opening of the suction housing 15. With this assembly, an inner space is formed in the housing 14.

The housing 14 has a suction port 14a and a discharge port 14b. The suction port 14a is formed in the peripheral wall 15b of the suction housing 15. The suction port 14a is located closer to the end wall 15a than the discharge housing 16 in the peripheral wall 15b of the suction housing 15. The refrigerant is sucked from the external refrigerant circuit 12 into the housing 14 through the suction port 14a. The discharge port 14b is formed in the discharge housing 16. The refrigerant is discharged to the external refrigerant circuit 12 through the discharge port 14b.

The electric compressor 11 includes a rotary shaft 17, a compression part 18, and a motor 19. The rotary shaft 17, the compression part 18, and the motor 19 are accommodated in the housing 14. The rotary shaft 17 is rotatably supported by the housing 14. The rotary shaft 17 is disposed in the housing 14 with an axial direction of the rotary shaft 17 coinciding with an axial direction of the peripheral wall 15b.

The compression part 18 is accommodated in the suction housing 15. The compression part 18 is a scroll type compression part including a fixed scroll fixed in the suction housing 15 and an orbiting scroll disposed so as to face the fixed scroll. Illustrations of the fixed scroll and the orbiting scroll are omitted. The compression part 18 is located closer to the discharge port 14b than the suction port 14a in the suction housing 15. The compression part 18 is connected to the rotary shaft 17. The compression part 18 is driven by the rotation of the rotary shaft 17 to compress the refrigerant.

The motor 19 is accommodated in the suction housing 15. The motor 19 is disposed between the compression part 18 and the end wall 15a in the suction housing 15. The motor 19 includes a rotor 20 and a stator 21. The stator 21 has a stator core 22 formed in a cylindrical shape, a u-phase coil 23u, a v-phase coil 23v, and a w-phase coil 23w.

Each of the u-phase coil 23u, the v-phase coil 23v, and the w-phase coil 23w is wound around the stator core 22. For example, the u-phase coil 23u, v-phase coil 23v, and w-phase coil 23w are connected in Y-connection. This aspect of the connection of the u-phase coil 23u, the v-phase coil 23v, and the w-phase coil 23w is not limited to the Y-connection and may be selected as appropriate. For example, the three coils may be connected in a delta-connection.

The rotor 20 is formed in a cylindrical shape. The rotor 20 is fixed to the rotary shaft 17. As a result, the rotary shaft 17 is formed so as to rotate integrally with the rotor 20. The stator 21 is fixed to the peripheral wall 15b of the suction housing 15. The rotor 20 and the stator 21 face each other in a radial direction of the rotary shaft 17.

The rotor 20 rotates when a current flows through the u-phase coil 23u, the v-phase coil 23v, and the w-phase coil 23w in a specified pattern. The rotary shaft 17 rotates with the rotation of the rotor 20. This drives the compression part 18. Thus, the motor 19 drives the compression part 18. The refrigerant flowing through the external refrigerant circuit 12 is sucked into the housing 14 through the suction port 14a. The compression part 18 compresses the refrigerant sucked into the housing 14. The compressed refrigerant is discharged into the external refrigerant circuit 12 through the discharge port 14b.

<Inverter>

The electric compressor 11 includes an inverter 30. The inverter 30 drives the motor 19. The housing 14 has an inverter cover 31 and a cover bottom wall 33. The inverter 30 includes the inverter cover 31 and the cover bottom wall 33. In other words, the inverter 30 has a part of the housing 14 made of metal. The cover bottom wall 33 and the inverter cover 31 are made of a metal material such as aluminum. The cover bottom wall 33 is formed in a plate shape extending along the end wall 15a. The inverter cover 31 is attached to the cover bottom wall 33 and the end wall 15a by bolts 32. The cover bottom wall 33 cooperates with the inverter cover 31 to form an inverter accommodation chamber S1.

The electric compressor 11 includes a connector 27. The connector 27 is electrically connected to a power storage device 28 mounted on the vehicle 100. The connector 27 is provided on the inverter cover 31. The connector 27 protrudes from the inverter cover 31. The power storage device 28 is a power source from which a power is supplied to any devices mounted on the vehicle 100. The power storage device 28 is a DC power source. The power storage device 28 is, for example, a rechargeable battery or a capacitor.

The inverter 30 has a circuit board 34. The circuit board 34 is accommodated in the inverter accommodation chamber S1. That is, the circuit board 34 is accommodated in the housing 14. The circuit board 34 is spaced from the cover bottom wall 33 at a predetermined distance in the axial direction of the rotary shaft 17 and faces the cover bottom wall 33. The circuit board 34 is accommodated in the inverter accommodation chamber S1 with a thickness direction of the circuit board 34 coinciding with the axial direction of the rotary shaft 17.

The inverter 30 includes an inverter circuit 35 and a noise reduction section 36. The inverter circuit 35 is configured to convert DC power to AC power. The noise reduction section 36 is provided on an input side of the inverter circuit 35. The noise reduction section 36, for example, reduces common mode noise and normal mode noise in a DC power that is to be input to the inverter circuit 35. Electronic components and switching elements that constitute the inverter circuit 35 and the noise reduction section 36 are mounted on the circuit board 34 and accommodated in the housing 14.

Figure 2:
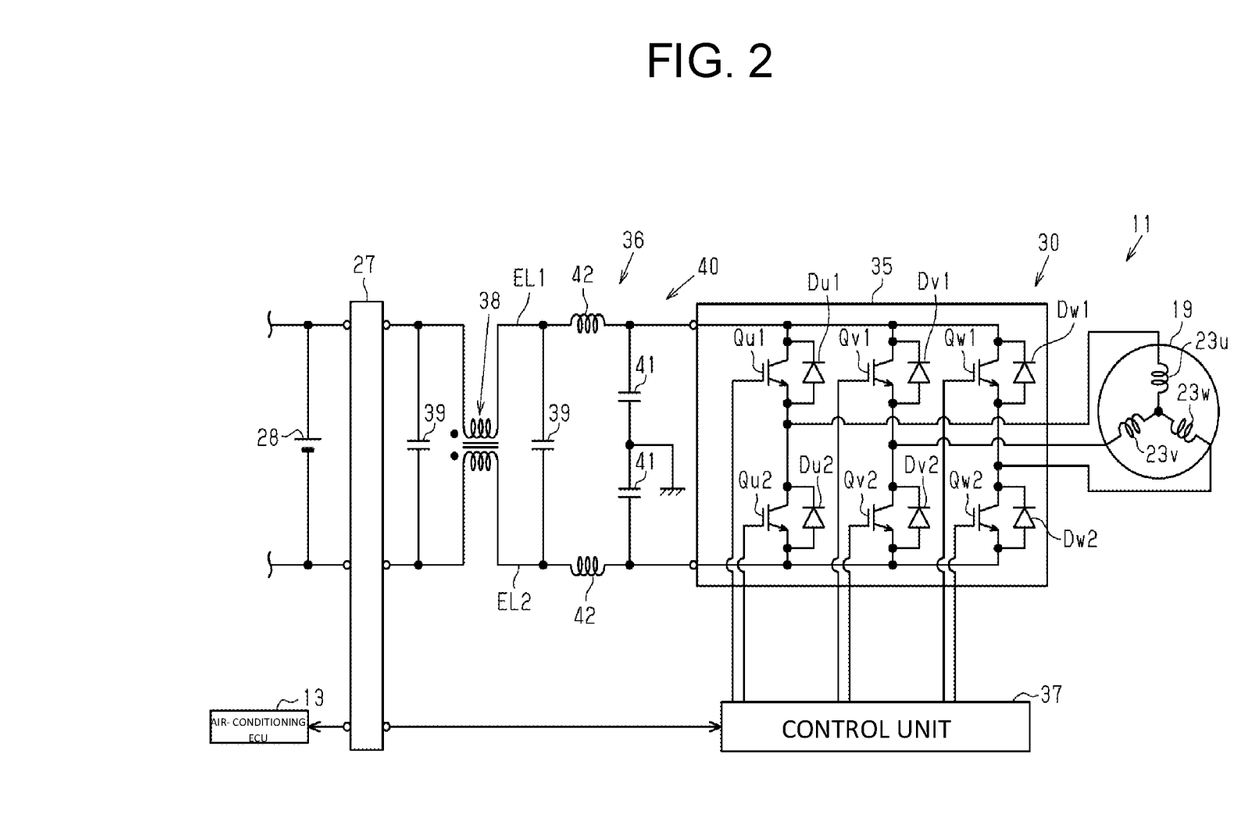
FIG. 2 is a circuit diagram illustrating an electric configuration of the inverter.

As illustrated in FIG. 2, the inverter circuit 35 has two connection lines EL1 and EL2. The inverter circuit 35 has u-phase switching elements Qu1 and Qu2 corresponding to the u-phase coil 23u. The inverter circuit 35 has v-phase switching elements Qv1 and Qv2 corresponding to the v-phase coil 23v. The inverter circuit 35 has w-phase switching elements Qw1 and Qw2 corresponding to the w-phase coil 23w. Each of the switching elements Qu1, Qu2, Qv1, Qv2, Qw1, Qw2 is a power switching element such as an IGBT. The switching elements Qu1, Qu2, Qv1, Qv2, Qw1, Qw2 are connected to freewheeling diodes Du1, Du2, Dv1, Dv2, Dw1, Dw2, respectively.

The u-phase switching elements Qu1, Qu2 are connected in series. Anode between the u-phase switching elements Qu1, Qu2 is connected to the u-phase coil 23u. A series connected body of the u-phase switching elements Qu1, Qu2 is electrically connected to both the connection lines EL1, EL2.

The v-phase switching elements Qv1, Qv2 are connected in series. A node between the v-phase switching elements Qv1, Qv2 is connected to the v-phase coil 23v. A series connected body of the v-phase switching elements Qv1, Qv2 is electrically connected to both the connection lines EL1, EL2.

The w-phase switching elements Qw1, Qw2 are connected in series. A node between the w-phase switching elements Qw1, Qw2 is connected to the w-phase coil 23w. A series connected body of the w-phase switching elements Qw1, Qw2 is electrically connected to both the connection lines EL1, EL2.

The inverter 30 includes a control unit 37. The control unit 37 controls switching operation of each of the switching elements Qu1 to Qw2. For example, the control unit 37 is formed of one or more processors (control circuits) that are operated according to computer programs (software) and/or one or more dedicated hardware circuits. The processor includes a CPU and a memory such as a RAM and a ROM. The memory stores the program codes or commands for causing the processor to execute various processes. The memory, that is, a computer readable medium, includes any available medium that is accessible by a general-purpose computer or a dedicated computer.

The control unit 37 is electrically connected to the air-conditioning ECU 13 through the connector 27. The control unit 37 periodically turns each of the switching elements Qu1 to Qw2 on and off in response to commands from the air-conditioning ECU 13. In detail, the control unit 37 performs pulse width modulation control (PWM control) of the switching elements Qu1 to Qw2 in response to the commands from air-conditioning ECU 13. More specifically, the control unit 37 generates control signals using a carrier signal and command voltage signals (comparison signal). The control unit 37 performs the ON/OFF control of each of the switching element Qu1 to Qw2 using the generated control signals to convert DC power to AC power.

The noise reduction section 36 includes a common mode choke coil 38, normal mode choke coils 42, and smoothing capacitors 39. The smoothing capacitors 39 cooperate with the common mode choke coil 38 and the normal mode choke coils 42 to form a low-pass filter 40. The low-pass filter 40 is provided on the connection lines EL1 and EL2. The low-pass filter 40 is provided between the connector 27 and the inverter circuit 35 for its circuitry. The common mode choke coil 38 and the normal mode choke coils 42 are provided on the connection lines EL1, EL2.

The smoothing capacitors 39 are each provided between the connector 27 and the common mode choke coil 38 and between the common mode choke coil 38 and the inverter circuit 35 for its circuitry. The smoothing capacitors 39 are X capacitors connected in parallel with the inverter circuit 35. The smoothing capacitors 39 are electrically connected to both connection lines EL1 and EL2.

The noise reduction section 36 has two Y-capacitors 41. The two Y-capacitors 41 are connected in series. A node between the two Y-capacitors 41 is grounded through the housing 14. The two Y-capacitors 41 are provided between the common mode choke coil 38 and the inverter circuit 35 for its circuitry. The two Y-capacitors 41 are connected in series with the common mode choke coil 38 and the normal mode choke coils 42. The two Y-capacitors 41 are connected in parallel with the smoothing capacitors 39. The two Y-capacitors 41 are provided between the smoothing capacitor 39 and the inverter circuit 35 for its circuitry.

The Y-capacitors 41 in this embodiment correspond to electronic components. Accordingly, the inverter 30 has the Y-capacitors 41 as the electronic components. The Y-capacitors 41 as the electronic components are mounted on the circuit board 34. The Y-capacitors 41 as the electronic components are accommodated in the housing 14.

The common mode choke coil 38 and the normal mode choke coils 42 suppress that high frequency noise generated on a side of the vehicle 100 is transmitted to the inverter circuit 35 of the electric compressor 11. The common mode choke coil 38 reduces common mode noise. The normal mode choke coils 42 reduces normal mode noise.

<Details of Circuit Board>

Figure 3:
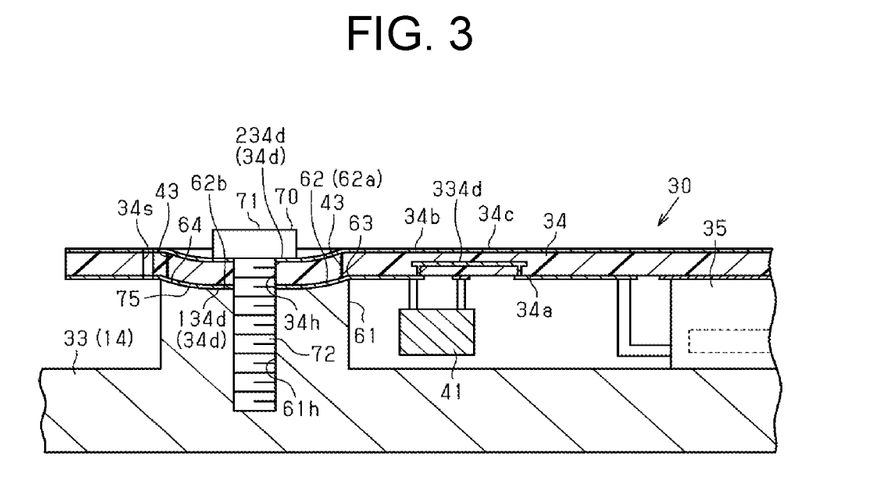
FIG. 3 is a cross-sectional view illustrating the inverter according to a present embodiment.

As illustrated in FIG. 3, the circuit board 34 has a first surface 34a corresponding to a back surface of the circuit board 34 and a second surface 34b corresponding to a front surface, which is opposite to the first surface 34a. The circuit board 34 is a glass epoxy board. A first ground pattern 134d is formed on the first surface 34a and serves as a ground pattern grounded through the housing 14. A second ground pattern 234d is formed on the second surface 34b and grounded through the housing 14. An inner layer ground pattern 334d may be also formed in an inner layer of the circuit board 34 and grounded through the housing 14. For example, the inner layer ground pattern 334d connects one part of the first ground pattern 134d formed in portions of the circuit board 34 on which the Y-capacitors 41 are mounted and another part of the first ground pattern 134d formed in a portion of the circuit board 34 on which the inverter circuit 35 is mounted.

A circuit pattern 34d is formed on the circuit board 34. A metal layer 34c is provided on the first surface 34a and forms a part of the circuit pattern 34d including the first ground pattern 134d. The metal layer 34c is also provided on the second surface 34b and forms a part of the circuit pattern 34d including the second ground pattern 234d. The electronic components, the switching elements, and the like that constitute the inverter circuit 35 and the noise reduction section 36 are mounted on the circuit pattern 34d. The first ground pattern 134d is connected to a ground line of the electronic components, the switching elements, and the like that constitute the inverter circuit 35 and the noise reduction section 36. The second ground pattern 234d is connected to a ground line of the electronic components, the switching elements, and the like that constitute the inverter circuit 35 and the noise reduction section 36.

As illustrated in FIG. 3, the first ground pattern 134d is partly overlapped with a part of the second ground pattern 234d in the thickness direction of the circuit board 34. The first ground pattern 134d is located near the cover bottom wall 33 of the housing 14. The second ground pattern 234d is located near the inverter cover 31, that is, on an opposite side of the cover bottom wall 33 in an axial direction of the housing 14. The first ground pattern 134d and the second ground pattern 234d are electrically connected through a plurality of through hole vias 43.

The circuit board 34 has through holes 34h extending in the thickness direction of the circuit board 34. The through holes 34h extend from the first surface 34a to the second surface 34b. The through holes 34h are round holes in plan view, for example. The through holes 34h opens in the first ground pattern 134d and the second ground pattern 234d. In detail, the through holes 34h are located in portions of the first ground pattern 134d distanced from edges of the first ground pattern 134d and portions of the second ground pattern 234d distanced from edges of the second ground pattern 234d. The through holes 34h opens toward the cover bottom wall 33 of the housing 14 on a side of the first surface 34a. The through holes 34h opens toward the inverter cover 31 on a side of the second surface 34b.

The circuit board 34 has slits 34s extending in the thickness direction of the circuit board 34. The slits 34s open in the first surface 34a and the second surface 34b. The slits 34s open toward the cover bottom wall 33 of the housing 14 on the side of the first surface 34a. The slits 34s open toward the inverter cover 31 on the side of the second surface 34b.

The slits 34s are formed in portions of the circuit board 34 except for a portion of the circuit board 34 between the through holes 34h and the portions on which the Y-capacitors 41 as the electronic components are mounted. In detail, the slits 34s are each formed in a semicircular shape extending along the through holes 34h in plan view, for example. The slits 34s are formed at positions of the circuit board 34 except for on the circuit pattern 34d. The slits 34s open in the first surface 34a at the positions of the circuit board 34 except for on the first ground pattern 134d and the circuit pattern 34d connecting the portions on which the Y-capacitors 41 are mounted and the first ground pattern 134d. The slits 34s open in the second surface 34b at positions of the circuit board 34 except for on the second ground pattern 234d. That is, there is a positional relationship around the through holes 34h in the circuit board 34 between a portion in which the slits 34s are not formed and the portions of the circuit board 34 on which the Y-capacitors 41 are mounted such that they are connected by an imaginary line extending along the first surface 34a.

<Boss>

Bosses 61 are formed in the housing 14. The bosses 61 protrude toward the circuit board 34. More specifically, the bosses 61 protrude from the cover bottom wall 33 of the housing 14 toward the first surface 34*a* of the circuit board 34. The bosses 61 are each formed in a columnar shape. A direction in which the bosses 61 protrude from the cover bottom wall 33 of the housing 14 coincides with the thickness direction of the circuit board 34. The bosses 61 are located at positions where the bosses 61 are not overlapped with the slits 34*s* of the circuit board 34 in plan view. The bosses 61 are located near the respective slits 34*s* and face the respective through hole vias 43.

Each of the bosses 61 has a contact surface 62 that is in contact with the first surface 34*a*. When an end of the boss 61 near the cover bottom wall 33 of the housing 14 is defined as a base end, the contact surface 62 is located at a tip of the boss 61 opposite to the base end across the boss 61 in the direction in which the bosses 61 protrude. The contact surface 62 is formed in a circular shape in plan view.

The bosses 61 each have a fastening hole 61*h*. The fastening hole 61*h* opens in the contact surface 62. More specifically, the fastening hole 61*h* is open in a center of the contact surface 62 in plan view. The fastening hole 61*h* extends from contact surface 62 toward the housing 14, more specifically, to the cover bottom wall 33 of the housing 14. The fastening hole 61*h* is defined by a cylindrical peripheral surface having an internal thread inside the boss 61. The fastening hole 61*h* does not face the through hole vias 43.

The contact surface 62 has an outer peripheral portion 62*a* on an outer peripheral side of an opening of the fastening hole 61*h*. The outer peripheral portion 62*a* has a recessed surface 64 that is recessed toward the fastening hole 61*h* from an outer peripheral side of the boss 61. In other words, the contact surface 62 has the recessed surface 64. The contact surface 62 has an inner peripheral portion 62*b* between the opening of the fastening hole 61*h* and the outer peripheral portion 62*a*. The inner peripheral portion 62*b* is located on an inner peripheral side of the outer peripheral portion 62*a* in the contact surface 62. The inner peripheral portion 62*b* is located closer to the cover bottom wall 33 of the housing 14 than the outer peripheral portion 62*a* in the thickness direction of the circuit board 34. The outer peripheral portion 62*a* is concave so as to approach the cover bottom wall 33 of the housing 14 as the outer peripheral portion 62*a* extends toward the inner peripheral portion 62*b*. As a result, the recessed surface 64 is concave toward the fastening hole 61*h* from the outer peripheral side of the boss 61. In plan view, the outer peripheral portion 62*a* is formed in a ring shape. In side view, an edge 63 of the outer peripheral portion 62*a* projects toward the first surface 34*a* of the circuit board 34. In plan view, the edge 63 of the outer peripheral portion 62*a* is formed in a ring shape.

The inner peripheral portion 62*b* is formed flat so as to extend in a direction perpendicular to the direction in which the bosses 61 protrude. The inner peripheral portion 62*b* is formed in a ring shape in plan view. The inner peripheral portion 62*b* is formed flat in side view. The inner peripheral portion 62*b* is formed flat such that the inner peripheral portion 62*b* extends toward the fastening hole 61*h*.

<Fastening Member>

The inverter 30 includes fastening members 70 made of metal. The circuit board 34 is fixed to the housing 14 by the fastening members 70. The fastening members 70 bring the first ground pattern 134*d* into contact with the contact surface 62 to ground the first ground pattern 134*d* through the housing 14. In other words, the first ground pattern 134*d* in the circuit pattern 34*d*, which is the ground pattern to be grounded through the housing 14, is brought into contact with the contact surface 62. The fastening members 70 do not bring the second ground pattern 234*d* into contact with the contact surface 62, but the second ground pattern 234*d* is grounded through the housing 14 by the fastening members 70. That is, the second ground pattern 234*d* is electrically connected to the housing 14 through the through hole vias 43. The fastening members 70 each have a head 71 and a threaded portion 72 extending from the head 71. The head 71 is, for example, formed in a circular flat plate shape. The threaded portion 72 is, for example, formed in a columnar shape. An external thread is formed on an outer peripheral surface of the threaded portion 72. The threaded portion 72 is inserted into the corresponding through hole 34*h* from an opening of the through hole 34*h* in the second surface 34*b*. Thus, the fastening members 70 are inserted into the respective through holes 34*h*. The head 71 is in contact with the second ground pattern 234*d*. A direction in which the threaded portion 72 extends from the head 71 coincides with the thickness direction of the circuit board 34. The threaded portion 72 is screwed into the corresponding fastening hole 61*h*. That is, the fastening members 70 are screwed into the respective fastening holes 61*h*. Thus, the fastening members 70 are fixed to the respective bosses 61. The circuit board 34 is fixed to the bosses 61 by the fastening members 70. When the fastening members 70 are fixed to the bosses 61, the circuit board 34 is fastened to the housing 14. Accordingly, the circuit board 34 is fixed to the housing 14 by the fastening members 70. The fastening members 70 bring the first ground pattern 134*d* into contact with the contact surface 62 to ground the first ground pattern 134*d* through the housing 14. The fastening members 70 do not bring the second ground pattern 234*d* into contact with the contact surface 62, but the second ground pattern 234*d* is grounded through the housing 14 by the fastening members 70. In other words, the second ground pattern 234*d* is connected to the housing 14 through the fastening members 70.

The inner peripheral portion 62*b* is overlapped with the head 71 of the corresponding fastening member 70 through the circuit board 34 in plan view. The inner peripheral portion 62*b* extends in parallel with the head 71. In other words, the head 71 is overlapped with a surface of the circuit board 34 that extends flat. In plan view, the head 71 is overlapped with the entire inner peripheral portion 62*b*. In plan view, the head 71 may be overlapped with only a part of the inner peripheral portion 62*b*.

<Contact of the Circuit Board into Contact Surface>

The circuit board 34 fixed to the housing 14 by the fastening members 70 is deformed and extends along the contact surface 62. In detail, the circuit board 34 is in contact with the outer peripheral portion 62*a* while being convex along the outer peripheral portion 62*a*. That is, the circuit board 34 has a protruding surface 75 that protrudes such that the first ground pattern 134*d* is in contact with the recessed surface 64. The protruding surface 75 is deformed between each of the slits 34*s* and the corresponding through hole 34*h* and extends through the contact surface 62. In addition, the circuit board 34 is in contact with the inner peripheral portion 62*b* while extending in the flat plate shape along the inner peripheral portion 62*b*. Thus, the circuit board 34 is fixed to the housing 14 while being in contact with the contact surface 62 of each of the bosses 61. A portion of the circuit board 34 in contact with the contact surface 62 of the boss 61 is the first ground pattern 134*d* formed on the first surface 34*a* of the circuit board 34. A portion of the circuit board 34 in contact with the head 71 is the second ground pattern 234d formed on the second surface 34b of the circuit board 34. A size of the first ground pattern 134d is designed such that the contact surface 62 is entirely in contact with the first ground pattern 134d. A size of the second ground pattern 234d is designed such that the second ground pattern 234d is entirely in contact with the head 71.

The slits 34s are each located on an outer peripheral side of the corresponding through hole 34h of the circuit board 34. The slit 34s is located on an outer peripheral side of a portion of the circuit board 34 in contact with the contact surface 62. That is, the slit 34s is located on an outer peripheral side of the protruding surface 75. The protruding surface 75 extends from the slit 34s to the through hole 34h. The slit 34s is closer to the corresponding through hole 34s than the Y-capacitors. The slit 34s is formed on the opposite side of the portions on which the Y-capacitors 41 are mounted across the through hole 34h in plan view.

Thus, when the fastening members 70 are fastened to the respective bosses 61, the circuit board 34 is deformed to be brought into contact with the contact surface 62 and fixed to the housing 14. Thus, the first ground pattern 134d is deformed to be grounded through the housing 14. The second ground pattern 234d is also deformed and electrically connected to the housing 14 through the fastening members 70. Noise is transmitted from the first ground pattern 134d to the housing 14, and then, transmitted from the housing 14 to the body of the vehicle 100. Noise is transmitted from the second ground pattern 234d to the housing 14 through the fastening members 70, and then, transmitted from the housing 14 to the body of the vehicle 100.

Operation in the Embodiment

The following will describe an operation of the embodiment together with a method of fastening the fastening members 70 to the respective bosses 61.

Figure 4:
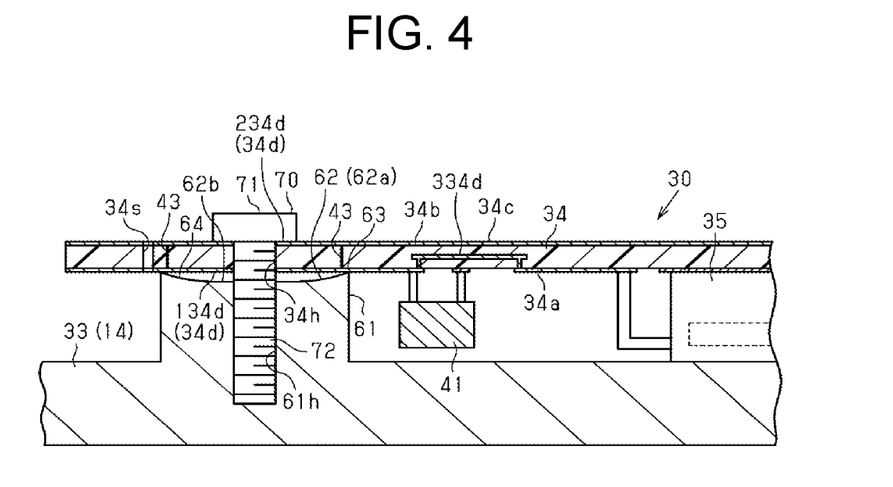
FIG. 4 is a cross-sectional view for explaining a method of fastening a fastening member to a boss in the present embodiment.

As illustrated in FIG. 4, the threaded portion 72 inserted into the through hole 34h is screwed into the fastening hole 61h of each of the bosses 61. Here, the circuit board 34 is not deformed along the contact surface 62 during a process in which the threaded portion 72 is screwed into the fastening hole 61h. Accordingly, the circuit board 34 extends in the flat plate shape on the bosses 61. The first surface 34a of the circuit board 34 is in contact with the edge 63 of the outer peripheral portion 62a of each of the bosses 61, for example.

As illustrated in FIG. 3, as the threaded portion 72 is screwed into the corresponding fastening hole 61h, the circuit board 34 is pushed toward the contact surface 62 by the head 71, which deforms the circuit board 34 along the contact surface 62. The circuit board 34 is convex along the outer peripheral portion 62a to be brought into contact with the outer peripheral portion 62a. A portion of the circuit board 34 around the through hole 34h is held between the head 71 and the inner peripheral portion 62b of the corresponding boss 61. This makes the portion of the circuit board 34 around the through hole 34h in the flat plate shape along the inner peripheral portion 62b and the portion is brought into contact with the inner peripheral portion 62b. Thus, the circuit board 34 is brought into contact with the contact surface 62 of each of the bosses 61.

Advantageous Effects of the Embodiment

The following will describe advantageous effects of the present embodiment.

(1) The contact surface 62 has the recessed surface 64 that is recessed toward the fastening hole 61h from the outer peripheral side of the boss 61. In the contact surface 62, the inner peripheral portion 62b is located closer to the cover bottom wall 33 of the housing 14 than the outer peripheral portion 62a in the thickness direction of the circuit board 34. The outer peripheral portion 62a is concave so as to approach the cover bottom wall 33 of the housing 14 as the outer peripheral portion 62a extends toward the inner peripheral portion 62b. The inner peripheral portion 62b is formed flat so as to extend in the direction perpendicular to the direction in which the bosses 61 protrude. On the other hand, the circuit board 34 fixed to the housing 14 by the fastening members 70 extends along the contact surface 62. The circuit board 34 has the protruding surface 75 that protrudes such that the first ground pattern 134d is in contact with the recessed surface 64. The first ground pattern 134d of the circuit board 34 is in contact with the outer peripheral portion 62a while being convex along the outer peripheral portion 62a. The first ground pattern 134d of the circuit board 34 is in contact with the inner peripheral portion 62b while extending in a flat plate shape along the inner peripheral portion 62b. Accordingly, as compared with a case where the contact surface 62 entirely extends flat, a contact area between the contact surface 62 of each of the bosses 61 and the first ground pattern 134d of the circuit board 34 is increased without increasing a width of the boss 61 in a radial direction thereof.

(2) The inner peripheral portion 62b is overlapped with the head 71 of each of the fastening members 70 through the circuit board 34 in plan view. In addition, the outer peripheral portion 62a is not overlapped with the head 71 through the circuit board 34 in plan view. With this configuration, when the circuit board 34 is held between the inner peripheral portion 62b and the head 71, the circuit board 34 is convex along the outer peripheral portion 62a. Accordingly, the first ground pattern 134d of the circuit board 34 is suitably brought into contact with the contact surface 62.

(3) The circuit board 34 has the slits 34s extending in the thickness direction of the circuit board 34. The slits 34s are each provided near the outer peripheral portion 62a. With this configuration, when the circuit board 34 is convex along the contact surface 62, openings of the slits 34s are widened, thereby causing the circuit board 34 to be deformed suitably. The slits 34s open in the first surface 34a at the positions of the circuit board 34 except for on the first ground pattern 134d and the circuit pattern 34d connecting the portions on which the Y-capacitors 41 are mounted and the first ground pattern 134d. The slits 34s open in the second surface 34b at the positions of the circuit board 34 except for on the second ground pattern 234d. This configuration suppresses interference with the transmission of the noise and other components.

(4) The edge 63 of the outer peripheral portion 62a projects toward the first surface 34a of the circuit board 34, and thus, when the circuit board 34 is convex along the contact surface 62, the circuit board 34 is deformed using the edge 63 of the outer peripheral portion 62a as a starting point, so that the circuit board 34 is suitably deformed.

Modification

The above-described embodiment may be modified as follows. The above-described embodiment and the following modifications may be combined with each other as long as they do not technically contradict each other.

Figure 5:
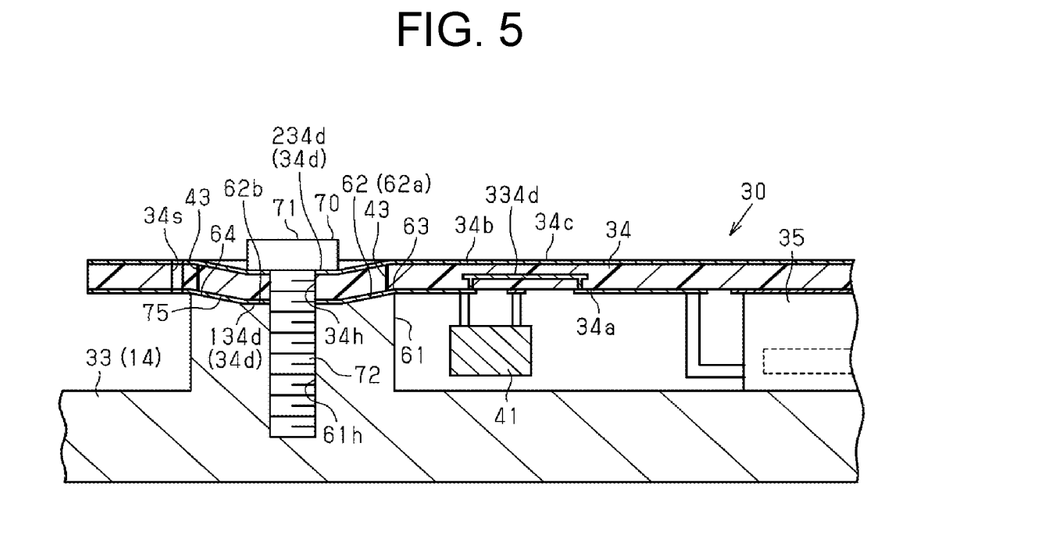
FIG. 5 is a cross-sectional view illustrating an inverter according to a modification.

As illustrated in FIG. 5, the outer peripheral portion 62a need not be concave in side view, but may be inclined in side view, that is, formed in a taper shape. In short, the recessed surface 64 may be inclined toward the fastening hole 61h from the outer peripheral side of the boss 61. In this case, the outer peripheral portion 62a is formed in a ring shape in plan view.

The edge 63 of the outer peripheral portion 62a need not project over an entire periphery of the edge 63, but the edge 63 of the outer peripheral portion 62a may partly project toward the first surface 34a. In this case, a portion of the edge 63 of the outer peripheral portion 62a that does not project may be formed flat, for example, such that the portion extends in the direction perpendicular to the direction in which the bosses 61 protrude.

The edge 63 of the outer peripheral portion 62a need not project over the entire periphery of the edge 63, but the edge 63 of the outer peripheral portion 62a may be chamfered over the entire periphery of the edge 63.

The slits 34s need not extend through the circuit board 34. In short, the slits 34s only need be open in one of the first surface 34a and the second surface 34b of the circuit board 34.

The slits 34s need not be formed in the circuit board 34.

The circuit board 34 may be a metal-based board instead of the glass epoxy board.

The inner peripheral portion 62b may be concave such that the inner peripheral portion 62b is continuous with the outer peripheral portion 62a. In addition, the inner peripheral portion 62b may be inclined such that the inner peripheral portion 62b is continuous with the outer peripheral portion 62a. In this case, the contact surface 62 is recessed toward the cover bottom wall 33 of the housing 14 as the contact surface 62 extends toward an opening edge of the fastening hole 61h.

In the housing 14, the portion that accommodates the circuit board 34 is formed integrally with the portion that accommodates the compression part 18 and the motor 19; however, they may be separately provided by increasing the number of housings.

Static electricity other than the noise may be transmitted by bringing the circuit board 34 into contact with the contact surface 62 of the boss 61.

The peripheral surface by which the through hole 34h of the circuit board 34 is defined may have a metal film that electrically connects the first surface 34a and the second surface 34b.

The first ground pattern 134d of the circuit board 34 may be in contact with the outer peripheral portion 62a and need not be in contact with the inner peripheral portion 62b. In this case, an area of the outer peripheral portion 62a is larger than that of the inner peripheral portion 62b. In addition, a contact area between the first ground pattern 134d of the circuit board 34 and the outer peripheral portion 62a is larger than a contact area between the first ground pattern 134d of the circuit board 34 and the contact surface 62 when the contact surface 62 entirely extends flat.

The compression part 18 need not be of a scroll type. For example, the compression part 18 may be of a piston type or a vane type.

The electronic device is used in the vehicle air conditioner 10; however, the present disclosure is not limited thereto. For example, the electronic device may be mounted on a fuel cell vehicle. The electric compressor 11 including the electronic device may compress air as fluid supplied to a fuel cell by the compression part 18.

What is claimed is:

1. An electronic device comprising:
   a housing made of metal;
   a circuit board that is accommodated in the housing and on which a circuit pattern is formed; and
   an electronic component that is accommodated in the housing and mounted on the circuit board,
   the housing having a boss that is formed in a columnar shape protruding toward the circuit board and to which the circuit board is fixed by a fastening member made of metal,
   the boss having a fastening hole into which the fastening member is screwed and a contact surface with which a ground pattern in the circuit pattern is in contact, the ground pattern being grounded through the housing, wherein
   the contact surface has a recessed surface that is recessed toward the fastening hole from an outer peripheral side of the boss, and
   the circuit board has a protruding surface that protrudes such that the ground pattern is in contact with the recessed surface.

2. The electronic device according to claim 1, wherein the recessed surface is concave toward the fastening hole from the outer peripheral side of the boss.

3. The electronic device according to claim 1, wherein the recessed surface is inclined toward the fastening hole from the outer peripheral side of the boss.

4. The electronic device according to claim 1, wherein the contact surface has an outer peripheral portion having the recessed surface and an inner peripheral portion formed flat such that the inner peripheral portion extends toward the fastening hole and located on an inner peripheral side of the outer peripheral portion, and
the inner peripheral portion is overlapped with a head of the fastening member through the circuit board.

5. The electronic device according to claim 1, wherein the circuit board has a slit located on an outer peripheral side of the protruding surface,
the slit is formed at a position of the circuit board except for on the circuit pattern, and
the protruding surface extends from the slit to a through hole of the circuit board into which the fastening member is inserted.

6. The electronic device according to claim 4, wherein an edge of the outer peripheral portion projects toward the circuit board.

* * * * *